(12) United States Patent
Kitahara et al.

(10) Patent No.: US 11,013,107 B2
(45) Date of Patent: May 18, 2021

(54) INSULATED CIRCUIT BOARD

(71) Applicant: MITSUBISHI MATERIALS CORPORATION, Tokyo (JP)

(72) Inventors: Takeshi Kitahara, Saitama (JP); Ryohei Yumoto, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/977,269

(22) PCT Filed: Feb. 26, 2019

(86) PCT No.: PCT/JP2019/007268
§ 371 (c)(1),
(2) Date: Sep. 1, 2020

(87) PCT Pub. No.: WO2019/167931
PCT Pub. Date: Sep. 6, 2019

(65) Prior Publication Data
US 2021/0007217 A1    Jan. 7, 2021

(30) Foreign Application Priority Data

Mar. 2, 2018 (JP) .............................. JP2018-037269

(51) Int. Cl.
*H05K 1/09* (2006.01)
*H05K 1/02* (2006.01)
(Continued)

(52) U.S. Cl.
CPC ............. *H05K 1/0271* (2013.01); *H05K 1/09* (2013.01); *H05K 3/022* (2013.01); *H05K 3/24* (2013.01);
(Continued)

(58) Field of Classification Search
CPC ...................... H05K 1/0306; H05K 1/09–097
See application file for complete search history.

(56) References Cited

U.S. PATENT DOCUMENTS

| 2004/0188828 A1 | 9/2004 | Nagatomo et al. |
| 2017/0053852 A1 | 2/2017 | Oi et al. |
| 2018/0301391 A1 | 10/2018 | Oohiraki et al. |

FOREIGN PATENT DOCUMENTS

| JP | 2004-221547 A | 8/2004 |
| JP | 2015-216370 A | 12/2015 |

(Continued)

OTHER PUBLICATIONS

International Search Report dated Apr. 23, 2019, issued for PCT/JP2019/007268.

*Primary Examiner* — Jeremy C Norris
(74) *Attorney, Agent, or Firm* — Locke Lord LLP

(57) ABSTRACT

An insulated circuit board having a ceramic substrate, a circuit layer on which a circuit pattern is formed and that is bonded to one surface of the ceramic substrate, and a metal layer bonded to the other surface of the ceramic substrate. The circuit layer has a first circuit layer that is bonded to the ceramic substrate and is made of aluminum and a second circuit layer that is bonded to the upper surface of the first circuit layer and is made of copper, the metal layer has a first metal layer that is bonded to the ceramic substrate and is made of aluminum and a second metal layer that is bonded to the upper surface of the first metal layer and is made of copper, and the thicknesses of the first circuit layer and the first metal layer are each 0.2 mm or more and 0.9 mm or less.

20 Claims, 4 Drawing Sheets

(51) Int. Cl.
*H05K 3/02* (2006.01)
*H05K 3/24* (2006.01)
*H05K 3/06* (2006.01)

(52) U.S. Cl.
CPC ..... *H05K 3/067* (2013.01); *H05K 2201/0352* (2013.01); *H05K 2201/0379* (2013.01); *H05K 2203/033* (2013.01); *H05K 2203/047* (2013.01)

(56) References Cited

FOREIGN PATENT DOCUMENTS

| | | |
|---|---|---|
| JP | 2017-73483 A | 4/2017 |
| JP | 2017-139508 A | 8/2017 |
| JP | 2017-228693 A | 12/2017 |

INSULATED CIRCUIT BOARD

BACKGROUND OF THE INVENTION

Technical Field

The present invention relates to an insulated circuit board such as a power module board that is used in a semiconductor device configured to control a large current and a high voltage. The present application claims priority based on Japanese Patent Application No. 2018-037269, filed on Mar. 2, 2018, and the content thereof is incorporated herein by reference.

Background Art

As an insulated circuit board, known is a power module board in which a circuit layer is bonded to one surface of an insulated substrate made of ceramic such as aluminum nitride and a metal layer is bonded to the other surface.

For example, in a power module board disclosed in Patent Document 1, each of a circuit layer and a metal layer bonded to an insulated substrate is formed of pure copper having a purity of 99.999% or more. Therefore, the repeated exertion of a temperature cycle causes recrystallization in the circuit layer and the metal layer, which reduces internal stress generated in the circuit layer and the metal layer and prevents the generation of cracks. However, there is a case where the above-described effect is not sufficient.

In recent years, an insulated circuit board in which an aluminum layer made of aluminum or an aluminum alloy is bonded to a surface of a ceramic substrate and a copper layer made of copper or a copper alloy is bonded to the upper surface of the aluminum layer by solid-phase diffusion has been used. Since the aluminum layer has a stress-buffering function, it is considered that the thickness of the aluminum layer, which is bonded to the surface of the ceramic substrate, and the thickness of the copper layer are preferably set to be substantially equal to each other. In addition, the stress-buffering function of the aluminum layer enables an increase in the thickness of the copper layer up to, for example, 0.4 mm or more.

CITATION LIST

Patent Literature

Patent Document 1 JP-A-2004-221547

SUMMARY OF INVENTION

Technical Problem

In a case where a circuit layer and a metal layer that are each made of aluminum or an aluminum alloy are bonded to the surfaces of a ceramic substrate, a circuit pattern is formed on the circuit layer, and then relatively thick metal sheets made of copper or a copper alloy are bonded to the upper surfaces of the circuit layer and the metal layer, depending on the shape, area, or the like of the circuit pattern, the balance between stress on the circuit layer-side surface of the ceramic substrate and stress on the metal layer-side surface collapses, and the ceramic substrate significantly warps.

Since a large warpage change during the soldering of an insulated circuit board hinders soldering, there is a desire for an insulated circuit board that changes only to a small extent due to warpage at a high temperature.

The present invention has been made in consideration of such circumstances, and an object of the present invention is to provide an insulated circuit board capable of suppressing a warpage change.

Solution to Problem

An insulated circuit board according to the present invention is an insulated circuit board including a ceramic substrate; a circuit layer that is bonded to one surface of the ceramic substrate and on which a circuit pattern is to be formed; and a metal layer that is bonded to the other surface of the ceramic substrate, in which the circuit layer has a first circuit layer that is bonded to the ceramic substrate and is made of aluminum or an aluminum alloy and a second circuit layer that is bonded to an upper surface of the first circuit layer and is made of copper or a copper alloy, the metal layer has a first metal layer that is bonded to the ceramic substrate and is made of aluminum or an aluminum alloy and a second metal layer that is bonded to an upper surface of the first metal layer and is made of copper or a copper alloy, thicknesses of the first circuit layer and the first metal layer are equal to each other and are each 0.2 mm or more and 0.9 mm or less, the second circuit layer has a thickness T1 of 0.65 mm or more and 2.0 mm or less, an area ratio S1/S2 of a bonding area S1 of the circuit layer to a bonding area S2 of the metal layer is 0.5 or more and 0.8 or less, and a thickness ratio T1/T2 of a thickness T1 of the second circuit layer to a thickness T2 of the second metal layer is 1.4 or more and 3.2 or less.

In the present invention, even when stress is generated between the circuit patterns on the ceramic substrate at the time of bonding the second circuit layer and the second metal layer to the upper surfaces of the first circuit layer and the first metal layer, since the thickness of the second metal layer is thinner than the thickness of the second circuit layer, it is possible to maintain the balance of stress between the circuit layer-side surface and the metal layer-side surface of the ceramic substrate. Therefore, it is possible to suppress a warpage change at a high temperature during soldering or the like while reducing the warpage of the insulated circuit board.

When the thickness ratio T1/T2 is less than 1.4, it is not possible to eliminate warpage that makes the circuit layer side convex. When the thickness ratio T1/T2 exceeds 3.2, the second metal layer is too thin, and the warpage change at a high temperature is large. Setting the thickness ratio T1/T2 as described above is effective for reducing warpage in a case where the area ratio S1/S2 is 0.5 or more and 0.8 or less. When the thicknesses of the first circuit layer and the first metal layer are less than 0.2 mm, the stress-buffering effect of aluminum or an aluminum alloy decreases, and, when the thicknesses exceed 0.9 mm, there is a large constraint on forming the circuit pattern.

As a preferred aspect of the insulated circuit board of the present invention, it is preferable that the second circuit layer is bonded to the upper surface of the first circuit layer by solid-phase diffusion and the second metal layer is bonded to the upper surface of the first metal layer by solid-phase diffusion.

In this insulated circuit board, the thickness T1 of the second circuit layer is more preferably 1.0 mm or more and 2.0 mm or less.

In this insulated circuit board, the area ratio S1/S2 is more preferably 0.6 or more and 0.8 or less.

In this insulated circuit board, the thickness ratio T1/T2 is more preferably 1.8 or more and 2.5 or less.

In this insulated circuit board, the thicknesses of the first circuit layer and the first metal layer are more preferably 0.2 mm or more and 0.6 mm or less.

In this insulated circuit board, the circuit pattern may have a circuit layer non-bonding portion having a width of 0.5 mm to 2.0 mm.

In this insulated circuit board, the ceramic substrate more preferably has a thickness of 0.2 mm to 1.2 mm.

Advantageous Effects of Invention

According to the present invention, it is possible to suppress a warpage change at a high temperature during soldering or the like of an insulated circuit board.

DESCRIPTION OF EMBODIMENTS

Hereinafter, an embodiment of the present invention will be described with reference to the drawings.

[Schematic Configuration of Insulated Circuit Board]

Figure 1:
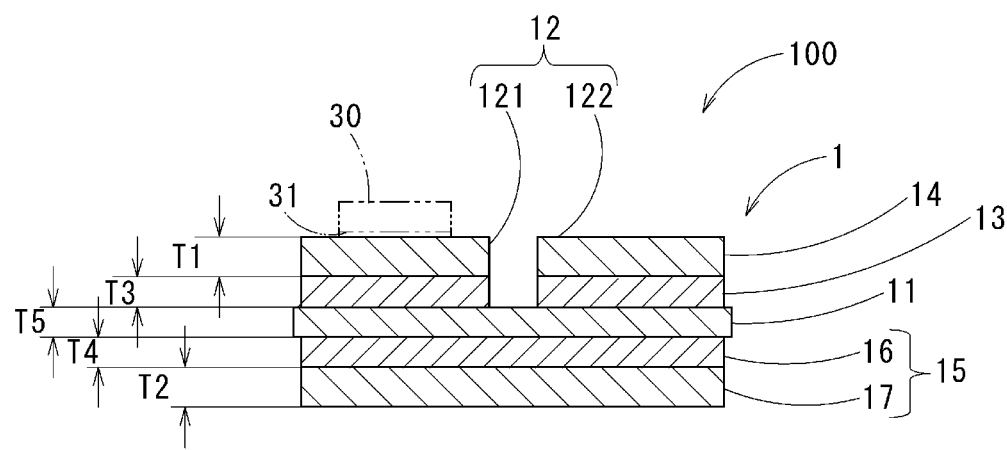
FIG. 1 is a cross-sectional view of a power module in which an insulated circuit board according to an embodiment of the present invention is used.

An insulated circuit board 1 that is manufactured by a method for manufacturing an insulated circuit board according to the present invention is a so-called power module board as shown in FIG. 1, and an element 30 is mounted on a surface of the insulated circuit board 1 as shown by a chain double-dashed line in FIG. 1 to configure a power module 100. The element 30 is an electronic component including a semiconductor, and a variety of semiconductor elements such as an insulated gate bipolar transistor (IGBT), a metal oxide semiconductor field effect transistor (MOSFET), and a free wheeling diode (FWD) semiconductor element are selected.

While not shown, the element 30 is provided with an upper electrode portion on the upper portion and a lower electrode portion on the lower portion, and the lower electrode portion is bonded to the upper surface of a circuit layer 12 with solder 31 or the like, whereby the element 30 is mounted on the upper surface of the circuit layer 12. The upper electrode portion of the element 30 is connected to a circuit electrode portion or the like of the circuit layer 12 through a lead frame or the like bonded with solder or the like.

[Configuration of Insulated Circuit Board]

The insulated circuit board 1 includes a ceramic substrate 11, the circuit layer 12 bonded to one surface of the ceramic substrate 11, and a metal layer 15 bonded to the other surface of the ceramic substrate 11.

The ceramic substrate 11 is a rectangular sheet-shaped insulated substrate that prevents electrical connection between the circuit layer 12 and the metal layer 15, is formed of, for example, aluminum nitride (AlN), silicon nitride ($Si_3N_4$), a zirconia-reinforced alumina substrate, or the like, and has a thickness T5 of 0.2 mm to 1.2 mm.

The ceramic substrate 11 of the present embodiment is formed of aluminum nitride and has a size set to 100 mm×110 mm and a thickness T5 set to 1.0 mm.

Figure 2A:
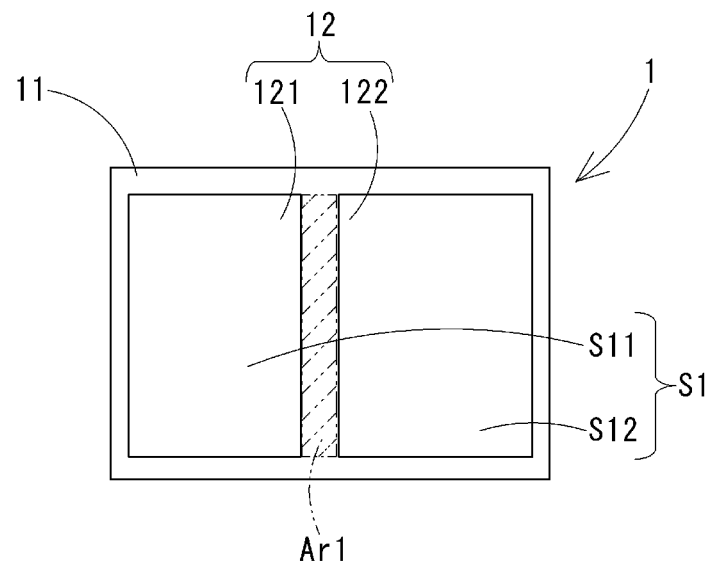
FIG. 2A is a plan view of the insulated circuit board in the embodiment as viewed from a circuit layer side.
Figure 2B:
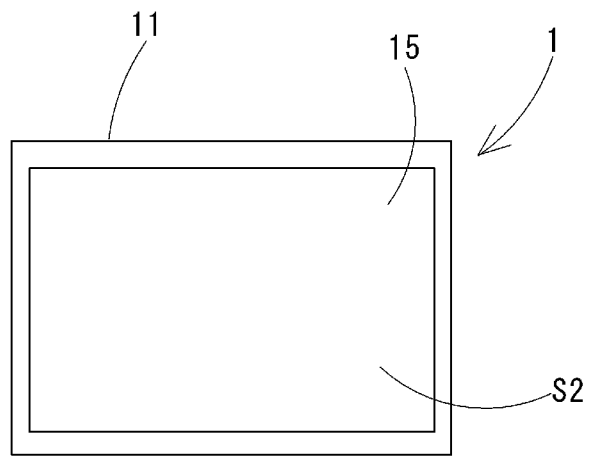
FIG. 2B is a plan view of the insulated circuit board in the embodiment as viewed from a metal layer side.

In the example shown in FIG. 1, FIG. 2A and FIG. 2B, the circuit layer 12 includes two small circuit layers 121 and 122 that are separated from each other to form a circuit pattern. The small circuit layers 121 and 122 are separately bonded to one surface of the ceramic substrate 11 at an interval (for example, 0.5 mm to 2.0 mm). In other words, an empty portion Ar1 having a width of 0.5 mm to 2.0 mm, to which the metal of the circuit layer 12 is not bonded, is formed between the small circuit layers 121 and 122. The circuit layer 12 includes first circuit layers 13 bonded to the ceramic substrate 11 and second circuit layers 14 bonded to the upper surfaces of the first circuit layers 13.

For the first circuit layer 13, pure aluminum or an aluminum alloy having a purity of 99% by mass or more is used, and, for example, aluminum in the 1xxx series in JIS, particularly, 1N99 (having a purity of 99.99% by mass or more: so-called 4N aluminum), can be used. The thickness of the first circuit layer 13 is 0.2 mm or more and 0.9 mm or less. This is because, when the thickness of the first circuit layer 13 is less than 0.2 mm, the stress-buffering effect of pure aluminum or an aluminum alloy is weak, and, when the thickness of the first circuit layer 13 exceeds 0.9 mm, a constraint on the formation of the circuit pattern becomes large.

The first circuit layer 13 of the present embodiment is formed of pure aluminum having a purity of 99% by mass or more and has a thickness T3 set to 0.6 mm.

The second circuit layer 14 is formed of copper such as oxygen-free copper or a copper alloy such as a zirconium-added copper alloy, and the thickness T1 of the second circuit layer 14 is set to 0.65 mm or more and 2.0 mm or less. The thickness T1 of the second circuit layer 14 is larger than the thickness T2 of a second metal layer 17 described below, and the thickness ratio T1/T2 is set to 1.4 or more and 3.2 or less.

The second circuit layer 14 of the present embodiment is formed of oxygen-free copper and has a thickness T1 set to 1.0 mm. The interval between the small circuit layers 121 and 122 is set to 1.0 mm.

The metal layer 15 includes a first metal layer 16 that is bonded to the ceramic substrate 11 and the second metal layer 17 that is bonded to the upper surface of the first metal layer 16.

Similar to the first circuit layer 13, the first metal layer 16 is formed using pure aluminum or an aluminum alloy having a purity of 99% by mass or more, and the thickness T4 of the first metal layer 16 is 0.2 mm or more and 0.9 mm or less.

The first metal layer 16 of the present embodiment is formed of pure aluminum having a purity of 99% by mass or more and has a thickness T4 set to 0.6 mm. That is, the first circuit layer 13 and the first metal layer 16 have the same composition and have the same thickness (T3=T4).

The second metal layer 17 is formed of copper such as oxygen-free copper or a copper alloy such as a zirconium-added copper alloy, and the thickness T2 of the second meal layer 17 is set to 0.4 mm or more and 1.4 mm or less. The thickness T2 of the second metal layer 17 is smaller than the thickness T1 of the second circuit layer 14, and the thickness ratio T1/T2 is set to 1.4 or more and 3.2 or less.

The second metal layer 17 of the present embodiment is formed of oxygen-free copper and has a thickness T2 set to 0.7 mm.

In the insulated circuit board 1 configured as described above, when the bonding area of the circuit layer 12 to the ceramic substrate 11 is represented by S1 ($mm^2$), and the bonding area of the metal layer 15 to the ceramic substrate 11 is represented by S2 ($mm^2$), the area ratio S1/S2 is adjusted to a relationship in which the area ratio becomes 0.5 or more and 0.8 or less. The bonding areas S1 and S2 are both a value at 30° C.

In the present embodiment, since the circuit layer 12 includes the small circuit layers 121 and 122, the bonding area S1 of the circuit layer 12 is the sum of the bonding area S11 of the small circuit layer 121 and the bonding area S12 of the small circuit layer 122 to the ceramic substrate 11.

[Method of Manufacturing Insulated Circuit Board]

Next, a method for manufacturing the insulated circuit board 1 of the present embodiment will be described. The method for manufacturing the insulated circuit board 1 includes a first bonding step of bonding a metal sheet for the first circuit layers 130 that is to serve as the first circuit layers 13 and is made of aluminum or an aluminum alloy and a metal sheet for the first metal layer 160 that is made of aluminum or an aluminum alloy and is to serve as the first metal layer 16 to the ceramic substrate 11, a circuit pattern formation step of forming a circuit pattern on the metal sheet for the first circuit layers 130 (first circuit layer precursor 13A) bonded by the first bonding step to form the first circuit layers 13, a metal sheet formation step of pressing copper or copper alloy sheets to form metal sheets for the second circuit layer 140 that are to serve as the second circuit layers 14 and to have a circuit pattern and one metal sheet for the second metal layer 170 that is to serve as the second metal layer 17, and a second bonding step of bonding the metal sheets for the second circuit layer 140 to the upper surfaces of the first circuit layers 13 and bonding the metal sheet for the second metal layer 170 to the upper surface of the first metal layer 16. Hereinafter, the manufacturing method will be described in order of these steps.

(First Bonding Step)

Figure 3A:
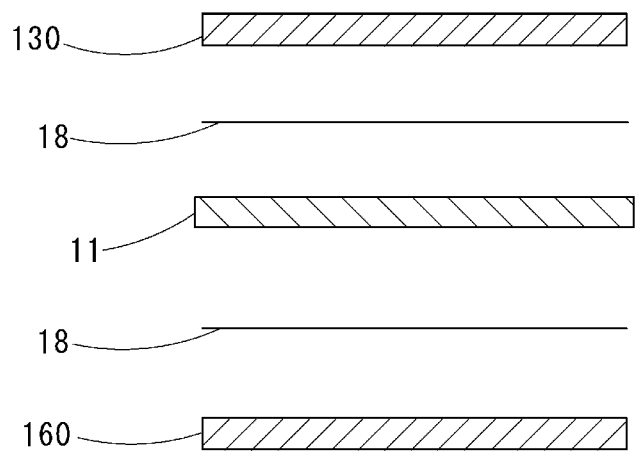
FIG. 3A is a cross-sectional view for describing a method for manufacturing the insulated circuit board shown in FIG. 1.
Figure 3B:
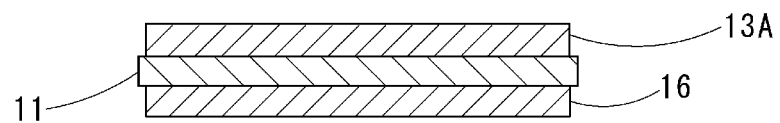
FIG. 3B is a cross-sectional view for describing the method for manufacturing the insulated circuit board shown in FIG. 1.

First, as shown in FIG. 3A, the metal sheet for the first circuit layers 130 and the metal sheet for the first metal layer 160 both having the same thickness are respectively bonded to the ceramic substrate 11 using an Al—Si-based brazing filler metal. Specifically, the metal sheet for the first circuit layers 130 and the metal sheet for the first metal layer 160 are laminated on the front surface and the back surface of the ceramic substrate 11 with Al—Si-based brazing filler metal foils 18 interposed therebetween. The laminate is sandwiched between carbon sheets and heated in a vacuum under a load applied in the laminating direction, thereby bonding the metal sheet for the first circuit layers 130 and the metal sheet for the first metal layer 160 to the ceramic substrate 11. As a result, a state, which is shown in FIG. 3B, in which the first circuit layer precursor 13A and the first metal layer 16 are respectively bonded to the front surface and the back surface of the ceramic substrate 11 through the bonding portions (brazing portions) is formed.

In this step, the pressure applied in the laminating direction is preferably set to 0.3 MPa to 1.5 MPa, and the temperature is preferably set to 630° C. or higher and 655° C. or lower. The Al—Si-based brazing filler metal foil is preferably 5 μm to 15 μm in thickness. In addition to the Al—Si-based brazing filler metal, an Al—Ge-based brazing filler metal, an Al—Cu-based brazing filler metal, an Al—Mg-based brazing filler metal, an Al—Mn-based brazing filler metal, or an Al—Si—Mg based brazing filler metal can also be used.

(Circuit Pattern Formation Step)

Figure 3C:
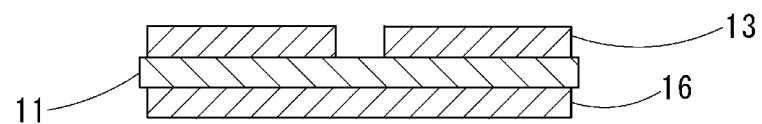
FIG. 3C is a cross-sectional view for describing the method for manufacturing the insulated circuit board shown in FIG. 1.

Next, a mask is printed on the surface of the first circuit layer precursor 13A and then etched using an acidic organic solvent or the like to form a circuit pattern. This mask is provided so as to form a circuit pattern as necessary on the surface of the first circuit layer precursor 13A. As a result, the circuit pattern is formed on the first circuit layer precursor 13A, and a state in which the first circuit layers 13 are bonded to the ceramic substrate 11 as shown in FIG. 3C is formed.

(Metal Sheet Formation Step)

Figure 4A:
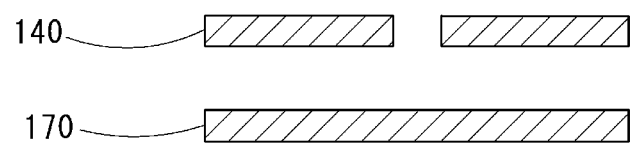
FIG. 4A is a cross-sectional view for describing the method for manufacturing the insulated circuit board shown in FIG. 1.

As shown in FIG. 4A, rolled sheets formed of copper or a copper alloy (hereinafter, referred to as rolled copper materials) are punched by pressing to form the metal sheets for the second circuit layer 140 and the metal sheet for the second metal layer 170. Specifically, a rolled copper material having a thickness of 0.4 mm or more and 1.4 mm or less is pressed to form the metal sheet for the second metal layer 170 having a rectangular sheet shape (for example, 95 mm×100 mm). In addition, rolled copper materials having a thickness of 0.65 mm or more and 2.0 mm or less are pressed to form two metal sheets for the second circuit layer 140 having a desired pattern shape (a rectangular sheet shape in the example shown in FIGS. 4A to 4C). The area ratio (the same as the area ratio S1/S2) of the total area (the same as the bonding area S1) of the metal sheets for the second circuit layer 140 formed as described above to the area (the same as the bonding area S2) of the metal sheet for the second metal layer 170 is set to 0.5 or more and 0.8 or less.

(Second Bonding Step)

Figure 4B:
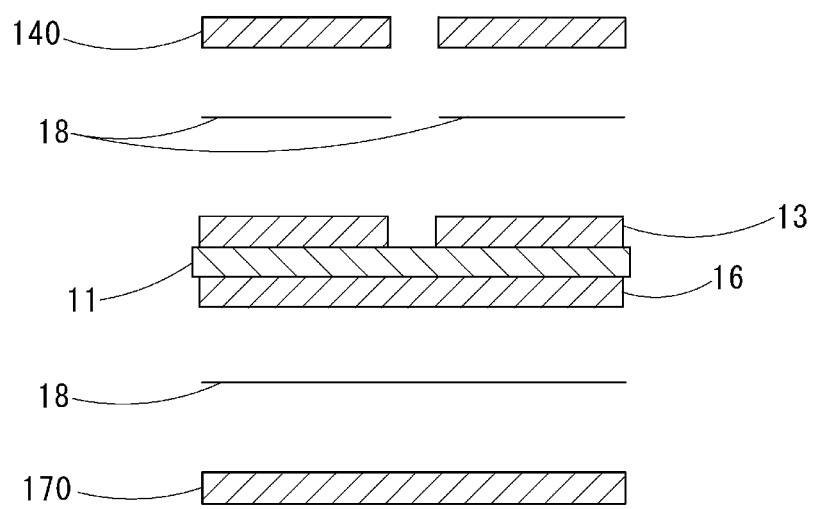
FIG. 4B is a cross-sectional view for describing the method for manufacturing the insulated circuit board shown in FIG. 1.

Next, as shown in FIG. 4B, each of the metal sheets for the second circuit layer 140 is bonded to the upper surface of the first circuit layer 13, and the metal sheet for the second metal layer 170 is bonded to the upper surface of the first metal layer 16. Specifically, the metal sheets for the second circuit layer 140 and the metal sheet for the second metal layer 170 are respectively laminated on the upper surfaces of the first circuit layers 13 and the upper surface of the first metal layer 16 with Ag—Cu—Ti-based brazing filler metal foils 18 respectively interposed between the metal sheet and the layer. The laminate is sandwiched between carbon sheets and heated in a vacuum under a load applied in the laminating direction, thereby bonding the metal sheets for the second circuit layer 140 to the first circuit layers 13 to form the second circuit layers 14 having the thickness T1 and bonding the metal sheet for the second metal layer 170 to the first metal layer 16 to form the second metal layer having the thickness T2.

Figure 4C:
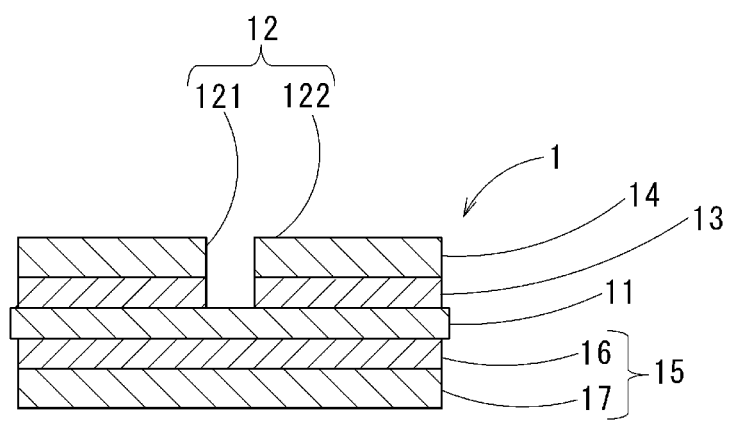
FIG. 4C is a cross-sectional view for describing the method for manufacturing the insulated circuit board shown in FIG. 1.

As a result, as shown in FIG. 4C, the insulated circuit board 1 in which the circuit layer 12 is bonded by solid-phase diffusion to the front surface of the ceramic substrate 11 through a bonding portion (brazing portion) and the metal layer 15 is bonded by solid-phase diffusion to the back surface of the ceramic substrate 11 through a bonding portion (brazing portion) is formed. The circuit layer 12 is formed by laminating the first circuit layers 13 and the second circuit layers 14, and the metal layer 15 formed by laminating the first metal layer 16 and the second metal layer 17.

In this step, the pressure applied in the laminating direction is preferably set to 0.1 MPa to 1.0 MPa, and the heating temperature is preferably set to 800° C. to 930° C. The Ag—Cu—Ti-based brazing filler metal foil is preferably 5 μm to 15 μm in thickness. In addition to the Ag—Cu—Ti-based brazing filler metal, a Cu—P-based brazing filler metal can also be used.

In the insulated circuit board 1 manufactured as described above, the thickness T1 of the second circuit layer 14 is 0.65 mm or more and 2.0 mm or less, the area S1/S2 of the bonding area S1 of the circuit layer 12 to the bonding area S2 of the metal layer 15 becomes 0.5 or more and 0.8 or less, and the thickness ratio T1/T2 of the thickness T1 of the second circuit layer 14 to the thickness T2 of the second metal layer 17 becomes 1.4 or more and 3.2 or less.

Here, in the bonding portion with the circuit layer 12 or the metal layer 15, compressive stress is generated on the front and back surfaces of the ceramic substrate 11. Since the pattern is formed on the front surface to which the circuit layer 12 is bonded, as shown in FIG. 2A, on the back surface of a circuit layer non-bonding portion Ar1 between the patterns (a region Ar 1 in which the ceramic substrate 11 is exposed due to the formation of the pattern), compressive stress is generated due to the metal layer 15, and, on the front surface, tensile stress is generated. Therefore, the ceramic substrate is likely to warp such that the circuit layer 12 side becomes convex. In this case, as the circuit layer 12 and the metal layer 15 become thicker, the ceramic substrate more significantly warps.

In contrast, even when a residual stress is generated in the circuit layer non-bonding portion Ar1 (the region Ar1) between the circuit patterns on the ceramic substrate 11, since the thickness T2 of the second metal layer 17 is thinner than the thickness T1 of the second circuit layer 14, it is possible to maintain the balance between the circuit layer 12-side surface and the metal layer 15-side surface of the ceramic substrate 11. Therefore, it is possible to suppress a warpage change at a high temperature during soldering.

Detailed configurations and the like are not limited to those in the configuration of the embodiment, and a variety of modifications can be added without departing from the gist of the present invention.

For example, in the above-described embodiment, the first circuit layers 13 are formed by etching the first circuit layer precursor 13A, but the present invention is not limited thereto, and a plurality of metal sheets punched by pressing may be bonded to the ceramic substrate 11.

In the above-described embodiment, an example in which the insulated circuit board 1 is used as a power module board has been described, but the insulated circuit board 1 can also be used as a variety of kinds of insulated boards such as a substrate for an LED element.

EXAMPLE

Next, the effects of the present invention will be described in detail using examples, but the present invention is not limited to the following examples.

Each of specimens of Examples 1 to 7 and Comparative Examples 1 to 4 is an insulated circuit board in which a circuit layer including a first circuit layer that was made of pure aluminum and had a thickness of 0.6 mm and a second circuit layer that was made of oxygen-free copper and had a thickness T1, a first metal layer that was made of pure aluminum and had a thickness of 0.6 mm, and a second metal layer that was made of oxygen-free copper and had a thickness T2 were bonded to a size of 100 mm×110 mm ceramic substrate that had a thickness of 1.0 mm and was made of aluminum nitride.

For each specimen, the thickness T1 of the second circuit layer, the thickness T2 of the second metal layer, the thickness ratio T1/T2, and the area ratio S1/S2 of the bonding area S1 of the circuit layer to the ceramic substrate and the bonding area S2 of the metal layer are shown in Table 1. The interval between two small circuit layers that configured the circuit layer was set to 1.0 mm in all of the specimens.

In Comparative Example 4, the circuit layer and the metal layer were provided with only the second circuit layer and the second metal layer both formed of oxygen-free copper and were not provided with any aluminum layers (the first circuit layer and the first metal layer).

The respective configuration members were bonded together by the manufacturing method described in the above-described embodiment to produce an insulated circuit board as each specimen. In addition, in a heating test designed to apply a series of temperature changes such that a sample was heated from 30° C. to 285° C. and then cooled to 30° C., for each of the obtained specimens, the amount of warpage during heating to 285° C. (warpage during heating) and the amount of warpage (returning warpage) at 30° C. when the specimen was heated to 285° C. and then cooled to 30° C. were respectively measured from the metal layer side.

The amount of warpage was obtained by measuring the change of the ceramic substrate in a rectangular range (75 mm×85 mm range) in the center of the ceramic substrate using a Moire-type three-dimensional shape measurement instrument, and the amount of change in the amount of warpage was also obtained. The amount of warpage was expressed as a "negative" value in a case where the metal layer became concave and expressed as a "positive" value in a case where the metal layer became convex.

For each of the insulated circuit boards of Examples 1 to 7 and Comparative Examples 1 to 4, a temperature cycle test in which the temperature was changed 500 times between −40° C. and 150° C. was carried out, and then whether or not there was a crack in the ceramic substrate was visually determined. At this time, in a case where there was a crack in the ceramic substrate, the insulated circuit board was evaluated as poor "B", and, in a case where there was no crack in the ceramic substrate, the insulated circuit board was evaluated as favorable "A". The results are shown in Table 1.

TABLE 1

|  | Presence or absence of aluminum layer | S1/S2 | T1 (mm) | T2 (mm) | T1/T2 | Warpage at 285° C. (μm) | Returning warpage (μm) | Amount of change (μm) | Evaluation of crack in ceramic substrate |
|---|---|---|---|---|---|---|---|---|---|
| Example 1 | Present | 0.75 | 1 | 0.45 | 2.22 | 430 | 380 | 50 | A |
| Example 2 | Present | 0.75 | 1 | 0.6 | 1.66 | 440 | −450 | 890 | A |
| Example 3 | Present | 0.75 | 1 | 0.7 | 1.42 | 510 | −430 | 940 | A |
| Example 4 | Present | 0.75 | 1.2 | 0.6 | 2.00 | 412 | 253 | 159 | A |
| Example 5 | Present | 0.75 | 1.5 | 0.7 | 2.14 | 385 | 125 | 260 | A |
| Example 6 | Present | 0.8 | 1 | 0.6 | 1.66 | 420 | −358 | 778 | A |
| Example 7 | Present | 0.67 | 1 | 0.6 | 1.66 | 411 | −330 | 741 | A |
| Comparative Example 1 | Present | 0.75 | 1 | 1.0 | 1.00 | 830 | −710 | 1540 | A |
| Comparative Example 2 | Present | 0.75 | 1 | 0.9 | 1.11 | 760 | −780 | 1540 | A |
| Comparative Example 3 | Present | 0.75 | 1 | 0.8 | 1.25 | 700 | −620 | 1320 | A |
| Comparative Example 4 | Absent | 0.75 | 1 | 0.45 | 2.22 | 320 | 450 | 130 | B |

As is clear from Table 1, it was possible to confirm that, in a case where the area ratio S1/S2 of the bonding area S1 of the circuit layer to the bonding area S2 of the metal layer was 0.5 or more and 0.8 or less, in Examples 1 to 7 in which the thickness ratio T1/T2 was 1.4 or more and 3.2 or less, the amounts of change were as small as 1000 μm or less, and the amounts of warpage were small at a high temperature during soldering or the like in the obtained insulated circuit boards.

In Comparative Example 4, since the area ratio S1/S2 and the thickness ratio T1/T2 were within the above-described ranges, the amount of change in the amount of warpage was small. However, since the circuit layer and the metal layer respectively did not have the first circuit layer and the first metal layer each made of aluminum or an aluminum alloy, the ceramic substrate cracked as a result of the temperature cycle test. Therefore, it was possible to confirm that, in order to suppress the cracking of the ceramic substrate, it is effective that the circuit layer and the metal layer respectively include the first circuit layer and the first metal layer that are bonded to the ceramic substrate and are made of aluminum or an aluminum alloy, the second circuit layer that is bonded to the upper surface of the first circuit layer and is made of copper or a copper alloy, and the second metal layer that is bonded to the upper surface of the first metal layer and is made of copper or a copper alloy.

INDUSTRIAL APPLICABILITY

A warpage change at a high temperature caused during soldering or the like of insulated circuit boards is suppressed.

REFERENCE SIGNS LIST

1 Insulated circuit board
11 Ceramic substrate
12 Circuit layer
13 First circuit layer
13A First circuit layer precursor
14 Second circuit layer
15 Metal layer
16 First metal layer
17 Second metal layer
18 Brazing filler metal foil
30 Element
31 Solder
100 Power module
121 Small circuit layer
122 Small circuit layer
130 Metal sheet for first circuit layer
140 Metal sheet for second circuit Layer
160 Metal sheet for first metal layer
170 Metal sheet for second metal layer
S1 Bonding area
S2 Bonding area
S11 Bonding area
S12 Bonding area
T1 Thickness of second circuit layer
T2 Thickness of second metal layer
T3 Thickness of first circuit layer
T4 Thickness of first metal layer
T5 Thickness of ceramic substrate
Ar1 Region (circuit layer non-bonding portion)

The invention claimed is:

1. An insulated circuit board comprising:
a ceramic substrate;
a circuit layer that is bonded to one surface of the ceramic substrate and on which a circuit pattern is to be formed; and
a metal layer bonded to the other surface of the ceramic substrate,
wherein the circuit layer has a first circuit layer that is bonded to the ceramic substrate and is made of aluminum or an aluminum alloy, and a second circuit layer that is bonded to an upper surface of the first circuit layer and is made of copper or a copper alloy,
the metal layer has a first metal layer that is bonded to the ceramic substrate and is made of aluminum or an aluminum alloy, and a second metal layer that is bonded to an upper surface of the first metal layer and is made of copper or a copper alloy,
thicknesses of the first circuit layer and the first metal layer are equal to each other and are 0.2 mm or more and 0.9 mm or less,
the second circuit layer has a thickness T1 of 0.65 mm or more and 2.0 mm or less,
an area ratio S1/S2 of a bonding area S1 of the circuit layer to the ceramic substrate to a bonding area S2 of the metal layer to the ceramic substrate is 0.5 or more and 0.8 or less, and a thickness ratio T1/T2 of the thickness T1 of the second circuit layer to a thickness T2 of the second metal layer is 1.4 or more and 3.2 or less.

2. The insulated circuit board according to claim 1,
wherein the second circuit layer is bonded by solid-phase diffusion to the upper surface of the first circuit layer, and
the second metal layer is bonded by solid-phase diffusion to the upper surface of the first metal layer.

3. The insulated circuit board according to claim 2, wherein the second circuit layer has a thickness T1 of 1.0 mm or more and 2.0 mm or less.

4. The insulated circuit board according to claim 2, wherein the area ratio S1/S2 is 0.6 or more and 0.8 or less.

5. The insulated circuit board according to claim 2, wherein the thickness ratio T1/T2 is 1.8 or more and 2.5 or less.

6. The insulated circuit board according to claim 2, wherein the first circuit layer and the first metal layer each have a thickness of 0.2 mm or more and 0.6 mm or less.

7. The insulated circuit board according to claim 2, wherein the circuit pattern has a circuit layer non-bonding portion having a width of 0.5 mm to 2.0 mm.

8. The insulated circuit board according to claim 2, wherein the ceramic substrate has a thickness of 0.2 mm to 1.2 mm.

9. The insulated circuit board according to claim 1, wherein the second circuit layer has a thickness T1 of 1.0 mm or more and 2.0 mm or less.

10. The insulated circuit board according to claim 9, wherein the area ratio S1/S2 is 0.6 or more and 0.8 or less.

11. The insulated circuit board according to claim 9, wherein the thickness ratio T1/T2 is 1.8 or more and 2.5 or less.

12. The insulated circuit board according to claim 9, wherein the first circuit layer and the first metal layer each have a thickness of 0.2 mm or more and 0.6 mm or less.

13. The insulated circuit board according to claim 9, wherein the circuit pattern has a circuit layer non-bonding portion having a width of 0.5 mm to 2.0 mm.

14. The insulated circuit board according to claim 9, wherein the ceramic substrate has a thickness of 0.2 mm to 1.2 mm.

15. The insulated circuit board according to claim 1, wherein the area ratio S1/S2 is 0.6 or more and 0.8 or less.

16. The insulated circuit board according to claim 15, wherein the first circuit layer and the first metal layer each have a thickness of 0.2 mm or more and 0.6 mm or less.

17. The insulated circuit board according to claim 1, wherein the thickness ratio T1/T2 is 1.8 or more and 2.5 or less.

18. The insulated circuit board according to claim 1, wherein the first circuit layer and the first metal layer each have a thickness of 0.2 mm or more and 0.6 mm or less.

19. The insulated circuit board according to claim 1, wherein the circuit pattern has a circuit layer non-bonding portion having a width of 0.5 mm to 2.0 mm.

20. The insulated circuit board according to claim 1, wherein the ceramic substrate has a thickness of 0.2 mm to 1.2 mm.

* * * * *